United States Patent [19]

Kipka

[11] Patent Number: 5,539,150

[45] Date of Patent: Jul. 23, 1996

[54] KIT AND METHOD OF MAKING RADIATION SHIELDS

[75] Inventor: Gary S. Kipka, Valencia, Calif.

[73] Assignee: American Etching & Manufacturing, Pacoima, Calif.

[21] Appl. No.: 374,250

[22] Filed: Jan. 18, 1995

[51] Int. Cl.⁶ .................................................. H05K 9/00
[52] U.S. Cl. ................... 174/35 R; 220/4.02; 250/519.1; 361/816
[58] Field of Search .............................. 174/35 R, 356 C, 174/35 MS; 361/816, 818; 250/515.1, 519.1; 220/62, 3.2, 416, 6, 4.01, 4.02

[56] References Cited

U.S. PATENT DOCUMENTS

| | | | |
|---|---|---|---|
| 2,488,710 | 9/1946 | Cooper | 174/35 |
| 3,816,911 | 6/1974 | Knappenberger | 29/626 |
| 4,331,285 | 5/1982 | Gottwals | 228/173 |
| 4,785,136 | 11/1988 | Mollet et al. | 174/35 R |
| 4,825,090 | 4/1989 | Grabis | 250/515.1 |
| 5,316,165 | 1/1993 | Moran, Jr. | 220/62 |
| 5,422,433 | 6/1995 | Rivera et al. | 174/35 GC |

Primary Examiner—Kristine L. Kincaid
Assistant Examiner—Robert J. Decker
Attorney, Agent, or Firm—Lyon & Lyon

[57] ABSTRACT

A radiation shield is fashioned from a kit having a plate of electrically conductive material with a grid of troughs cut therein. The grid is used to trace the dimensions of a portion of the electrically conductive plate needed to fashion a particular radiation shield. The troughs are cut to a sufficient depth to allow material to be snapped back and broken off by hand along the troughs. Material is bent at 90 degree angles along the troughs to form walls for a radiation shield. Thus, radiation shields in the form of various rectilinear boxes comprising a wide variety of shapes and dimensions may be fashioned from a kit according to the present invention.

9 Claims, 3 Drawing Sheets

5,539,150

KIT AND METHOD OF MAKING RADIATION SHIELDS

BACKGROUND OF THE INVENTION

The field of the present invention is radiation shields.

Electrical circuits are known to be susceptible to performance degradation or malfunction when exposed to extraneous electromagnetic radiation. A well known solution to this problem is to shield the affected circuits from interference from the undesired radiation. Conveniently, this is accomplished by establishing a radiation shield enveloping the electrical circuit to be protected. A radiation shield also may be established enveloping a source of undesired radiation.

Typically, a radiation shield is fabricated according to the desired shape and dimensions and adapted for connection to an electrical circuit board. Thus, a device or system comprising several electrical circuits may require fabrication of several different radiation shields with a variety of shapes and dimensions. Moreover, in the development and manufacture of a circuit, the dimensions may change, in which case a new radiation shield must be fabricated.

Prototype radiation shields as are well known in the art, tailored to specific desired physical dimensions, typically cost $500–$600 or more per unit to manufacture. Moreover, it may require four weeks to obtain such a prototype radiation shield. This lead time is especially onerous when, unexpectedly, radiation shielding requirements change during development of an electrical device or system.

Consequently, it is desired to have a means for quickly and inexpensively fabricating radiation shields with a wide range of shapes and dimensions.

SUMMARY OF THE INVENTION

The present invention is directed to a kit and method for of making radiation shields.

In one, separate, aspect of the invention, a grid of troughs is cut into a plate of electrically conductive material to produce a kit for fashioning radiation shields. The kit may be quickly and inexpensively fashioned into radiation shields in the form of various rectilinear boxes. Shields possessing a wide variety of shapes and dimensions may be fashioned from the kit.

In a second, separate, aspect of the invention, a one-piece radiation shield is fashioned from a kit comprising a single plate of electrically conductive material with a grid of troughs cut therein. The grid may be used to trace the dimensions of a portion of the electrically conductive plate needed to fashion a particular radiation shield. The troughs are cut to a sufficient depth to allow material to be snapped back and broken off by hand along the troughs. This allows easy separation of the portion of electrically conductive material which is required for making a particular radiation shield. The troughs also facilitate manipulation of the material to form walls for the radiation shield. Thus, radiation shields in the form of various rectilinear boxes comprising a wide variety of shapes and dimensions may be fashioned from a kit according to the present invention.

Accordingly, it is an object of the present invention to provide a kit for making radiation shields comprising a wide variety of shapes and sizes. It is a further object of the present invention to provide a method of fashioning radiation shields comprising a wide variety of shapes and sizes from a kit comprising a single plate of electrically conductive material. Other and further objects and advantages will appear hereinafter.

DESCRIPTION OF THE PREFERRED EMBODIMENT

Figure 1:
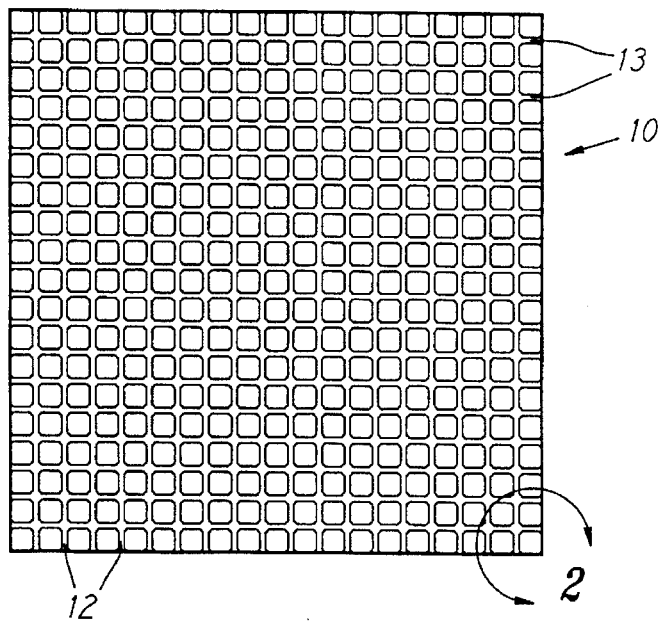
FIG. 1 is a plan view of an electrically conductive plate with a grid of troughs cut therein.

Turning in detail to the drawings, FIG. 1 illustrates a radiation shield kit 10, comprising an electrically conductive plate wherein is cut a grid of troughs. The electrically conductive plate may be a thin plate of copper or other suitable material.

In a preferred embodiment, the grid of troughs may be formed by photochemical etching. In photochemical etching, an electrically conductive plate is cleaned prior to depositing a layer of photoresist on the surface. A photoimage is transferred to the plate surface by selectively exposing the photoresist material to light using a negative mask. In the areas exposed to light, the photoresist is hardened. The plate is then exposed to an etching chemical such as ferrochloric acid which reacts with and removes copper from the surface. The hardened photoresist acts as a barrier to the etching chemical and prevents the surface area under the photoresist from .being removed. By varying the strength of the etching chemical and/or the exposure time, troughs can be etched to any desired depth. Finally, the plate is washed to remove traces of etching chemical and the photoresist material.

Figure 2:
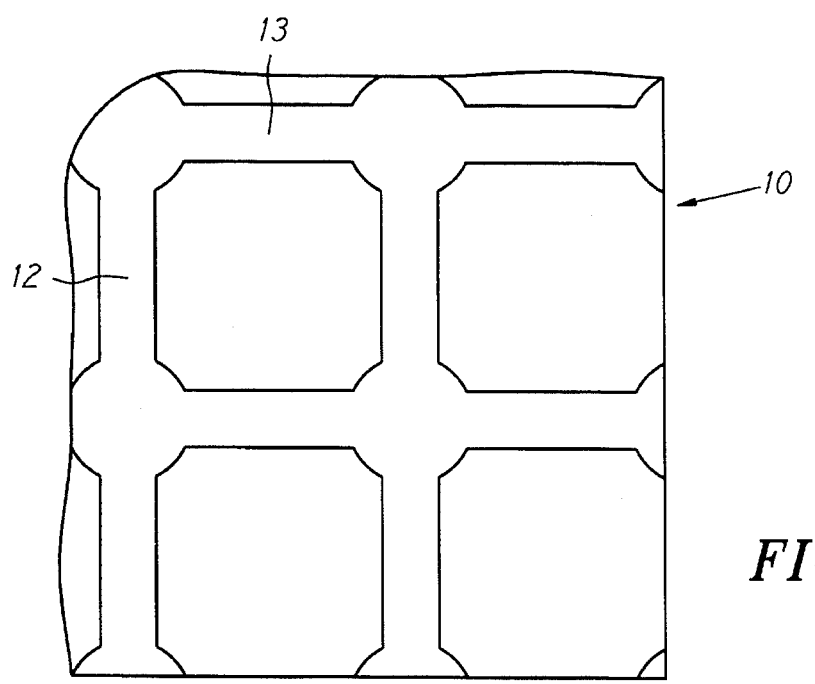
FIG. 2 is a detail view of the electrically conductive plate taken at line 2 of FIG. 1.

As can be seen more clearly in FIG. 2, a first set of parallel troughs 12 are cut into the electrically conductive plate. A second set of parallel troughs 13, each perpendicular to the first set of parallel troughs 12, also are cut into the plate. The two sets of parallel troughs thus form a grid on the electrically conductive plate.

Figure 3:
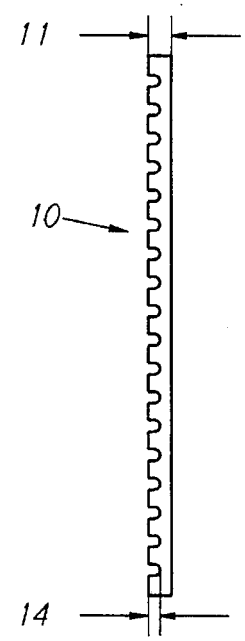
FIG. 3 ms an elevation view of the electrically conductive plate of FIG. 1.

FIG. 3 illustrates the depth 14 of the troughs which are cut into the electrically conductive plate. The depth 14 is sufficient to allow portions of the electrically conductive plate to be broken off and separated easily by hand by bending the material back and forth along a trough. In a preferred embodiment, the depth 14 of the troughs is approximately equal to one half the thickness 11 of the plate of electrically conductive material In a preferred embodiment, the thickness 11 of the plate is approximately 10 mils.

In a preferred embodiment, the electrically conductive plate is plated with tin-lead solder.

FIGS. 4 through 7 illustrate how a radiation shield in the shape of an open rectangular box may be fashioned from a radiation shield kit 10 according to the present invention.

Figure 4:
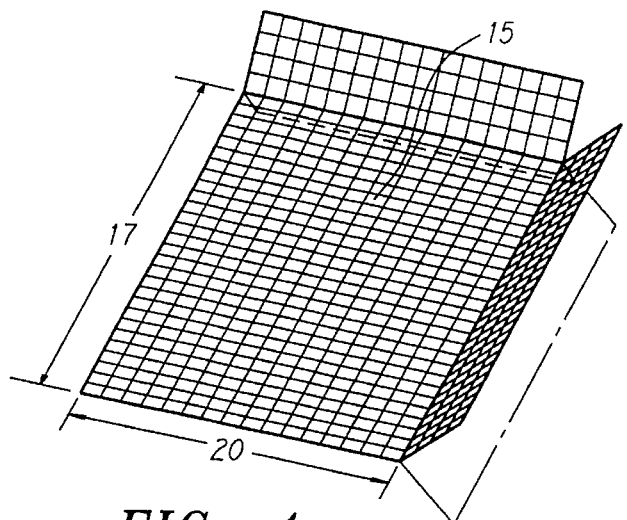
FIG. 4 is a perspective view of a rectangular portion of the electrically conductive plate of FIG. 1, partially folded.

FIG. 4 illustrates a rectangular portion 15 of the radiation shield kit 10 used no fashion a radiation shield 16. The dimensions of the rectangular portion 15 needed to fashion the radiation shield 16 are determined as follows. The length 17 of the rectangular portion 15 is selected to be equal to the length 18 plus twice the height 19 of the desired radiation shield 16. The width 20 of the rectangular portion 15 is equal to the width 21 plus twice the height 19 of the radiation shield 16. The rectangular portion 15 is separated from the remainder of the radiation shield kit 10 by bending the material back and forth by hand along the troughs.

Figure 5:
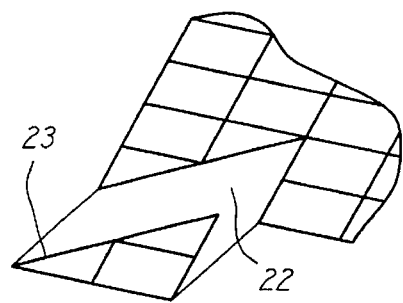
FIG. 5 is a detail view of a corner of the rectangular portion of FIG. 4 with a portion removed.

FIG. 5 illustrates how a diagonal cut 22 is made, bisecting each corner of the rectangular portion is, creating eight triangular corner slugs 23. Each triangular corner slug 23 is removed from the rectangular portion 15 by bending it back along a trough until it breaks off. This produces a cross-shaped portion 24 of electrically conductive material.

Figure 6:
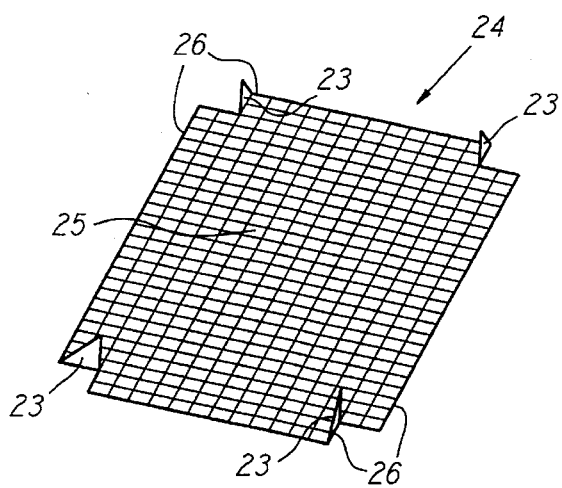
FIG. 6 is perspective view of a cross-shaped portion of the electrically conductive plate of FIG. 1 with portions being removed.

FIG. 6 illustrates the cross-shaped portion 24, comprising a rectangular center portion 25 and four flaps 26, joined along troughs on the grid. Each flap 26 is bent inward along a trough to form the four walls 27 of a radiation shield 16. The rectangular center portion 25 thus becomes the top 28 of the radiation shield 16. Conveniently, the four walls 27 thus may be joined together by soldering.

Figure 7:
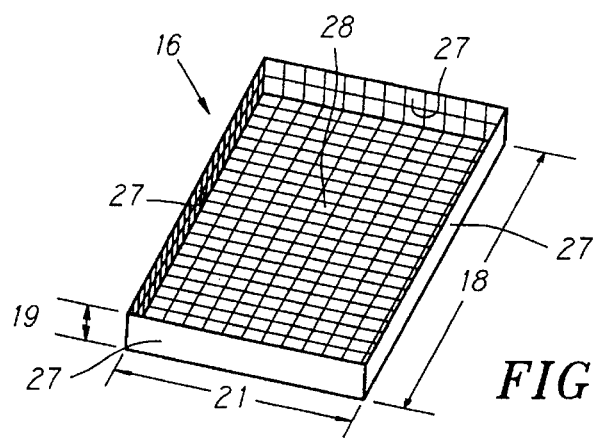
FIG. 7 is a perspective view of a radiation shield which has been fashioned according to the present invention.

FIG. 7 illustrates a radiation shield 16 in the form of an open box which is made from a radiation shield kit 10 according to the method described above. The radiation shield has dimensions: length 18, width 21 and height 19. Conveniently, the shield 16 may be attached to a circuit board by soldering along the edges of the four walls 27.

According to the present invention, the disclosed kit can be used to fashion radiation shields comprising a wide variety of shapes and dimensions. Although some forms of radiation shields are discussed herein for illustration, many more configurations are possible. FIGS. 8–11 illustrate some possible forms.

Figure 8:
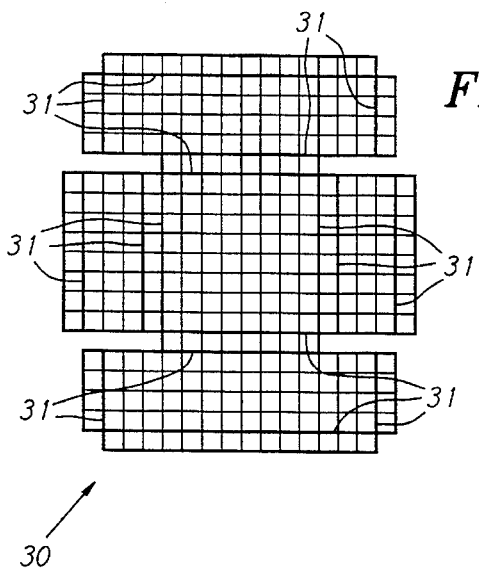
FIG. 8 is a plan view of a portion of the electrically conductive plate of FIG. 1 for forming an open two-level rectangular box.
Figure 9:
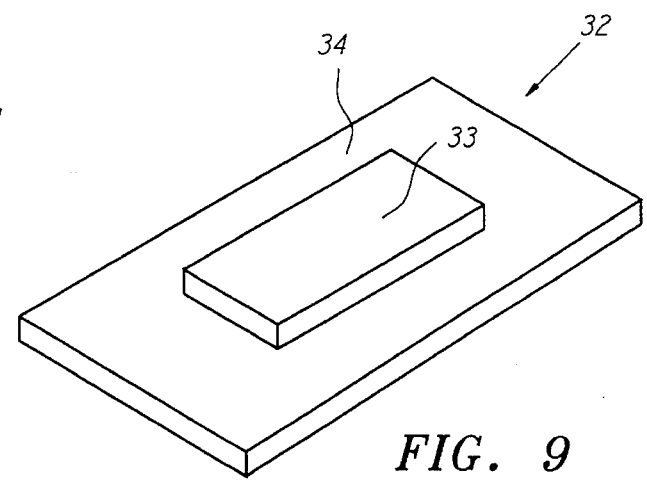
FIG. 9 is a perspective view of a radiation shield in the form of an open two-level rectangular box which has been fashioned according to the present invention.

FIGS. 8 and 9 illustrate how the radiation shield kit 10 may be used to fashion a radiation shield in the form of an open two-level rectangular box. Radiation shield piece 30 is formed by cutting and breaking off unwanted portions of radiation shield kit 10 as discussed above. Radiation shield piece 30 is bent along the illustrated troughs 31 to form radiation shield 32. The walls for the upper level 33 and lower level 34 of shield 32 each may be joined by soldering. As shown, radiation shield 32 is in the form of an open two-level rectangular box.

Figure 10:
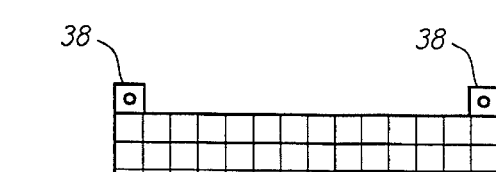
FIG. 10 is a plan view of a portion of the electrically conductive plate of FIG. 1 for forming an closed two-level rectangular box with tabs.
Figure 10:
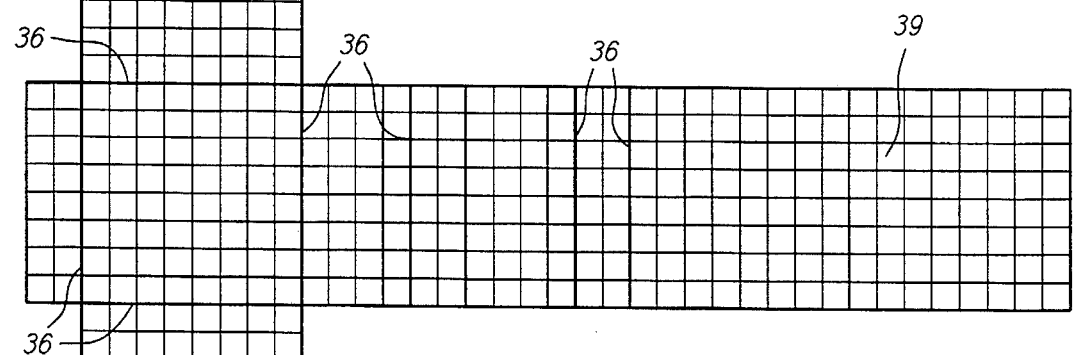
Figure 11:
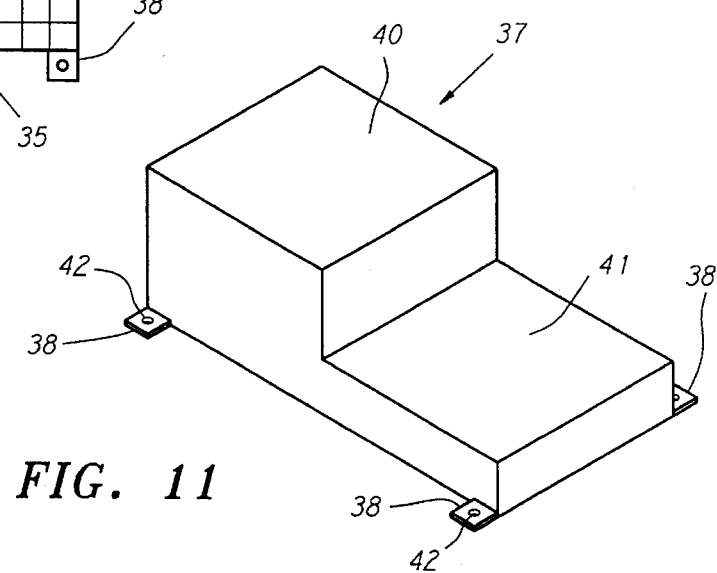
FIG. 11 is a perspective view of a radiation shield in the form of a closed two-level box with tabs which has been fashioned according to the present invention.

FIGS. 10 and 11 illustrate another possible radiation shield 37 which may be fashioned using the radiation shield kit 10. As above, radiation shield piece 35 is formed from radiation shield kit 10 by cutting and breaking off unwanted portions. Radiation shield piece 35 is Dent along the illustrated troughs 36 to form radiation shield 37. Radiation shield 37 comprises a two-level closed box, with tabs 38 for attachment to a structure such as an electrical circuit board. Rectangular portion 39 is bent underneath upper level 40 and lower level 41 to form the bottom of a closed box. As illustrated, holes 42 may be drilled into the tabs 38 to facilitate attachment of radiation shield 37 to other structures.

Thus, a kit comprising an electrically conductive plate with a grid of troughs cut therein, and a method for fashioning radiation shields from said plate, are disclosed. While embodiments and applications of this invention have been shown and described, it would be apparent to those skilled in the art that many more modifications are possible without departing from the inventive concepts herein. The invention, therefore, is not to be restricted except in the spirit of the appended claims.

What is claimed is:

1. A kit for forming a radiation shield, comprising an electrically conductive plate having uniformly spaced parallel first straight troughs extending longitudinally fully across the plate and uniformly spaced parallel second straight troughs extending longitudinally fully across the plate perpendicular to the first troughs, the first and second troughs having sufficient depth to allow bending of the plate at any one of the troughs to 90° in either direction with all bending occurring at the trough and breaking of the plate at any one of the troughs by bending of the plate at the trough sequentially in both directions at least once.

2. The kit of claim 1 wherein the depth of the first and second troughs is at least approximately one half the electrically conductive plate's thickness.

3. The kit of claim 1 wherein the electrically conductive plate is copper.

4. The kit of claim 1 wherein the electrically conductive plate is plated with tin-lead solder.

5. A method of fabricating a radiation shield comprising the steps of cutting a grid of troughs into an electrically conductive plate, separating material from said plate along the troughs on said grid to form a rectangular portion of said plate with four corners, cutting the four corners of said rectangular portion to create eight corner slugs, removing the eight corner slugs of said rectangular portion to form a cross-shaped portion comprising a rectangular center portion and four flaps joined to said rectangular center portion along four troughs, and bending the four flaps of said cross-shaped portion along said four troughs to form a radiation shield with a cover and four walls.

6. The method of claim 5 wherein the electrically conductive plate is copper.

7. The method of claim 5 wherein the grid of troughs is cut by photochemical etching.

8. A radiation shield in the form of an open box comprising four walls and a cover, said radiation shield comprising a single plate of electrically conductive material, said four walls and cover joined along troughs cut into said plate of electrically conductive material.

9. The radiation shield of claim 8 wherein the troughs have a depth which is approximately at least one half the electrically conductive plate's thickness.

* * * * *